(12) United States Patent
Weber et al.

(10) Patent No.: US 12,550,387 B2
(45) Date of Patent: Feb. 10, 2026

(54) TRENCH JUNCTION FIELD EFFECT TRANSISTOR HAVING A MESA REGION

(71) Applicant: Infineon Technologies Austria AG, Villach (AT)

(72) Inventors: Hans Weber, Villach (AT); David Kammerlander, Villach (AT); Andreas Riegler, Wernberg (AT)

(73) Assignee: Infineon Technologies Austria AG, Villach (AT)

( * ) Notice: Subject to any disclaimer, the term of this patent is extended or adjusted under 35 U.S.C. 154(b) by 442 days.

(21) Appl. No.: 18/106,768

(22) Filed: Feb. 7, 2023

(65) Prior Publication Data

US 2023/0261117 A1 Aug. 17, 2023

(30) Foreign Application Priority Data

Feb. 11, 2022 (EP) .................................... 22156243

(51) Int. Cl.
| | |
|---|---|
| *H01L 21/04* | (2006.01) |
| *H10D 12/01* | (2025.01) |
| *H10D 30/83* | (2025.01) |
| *H10D 62/17* | (2025.01) |
| *H10D 62/832* | (2025.01) |

(52) U.S. Cl.
CPC ......... *H10D 30/831* (2025.01); *H01L 21/047* (2013.01); *H10D 12/031* (2025.01); *H10D 62/328* (2025.01); *H10D 62/8325* (2025.01)

(58) Field of Classification Search
CPC .... H10D 62/328; H10D 30/831; H10D 30/83; H10D 30/832; H10D 30/0512; H10D 30/051; H10D 30/0515; H10D 30/0516
See application file for complete search history.

(56) References Cited

U.S. PATENT DOCUMENTS

| | | | |
|---|---|---|---|
| 2009/0278177 A1 | 11/2009 | Sankin et al. | |
| 2010/0163935 A1* | 7/2010 | Shimizu | H10D 30/831 |
| | | | 257/E29.313 |
| 2016/0380117 A1* | 12/2016 | Bhalla | H10D 62/117 |
| | | | 257/77 |
| 2018/0076286 A1* | 3/2018 | Inomata | H01L 21/046 |
| 2022/0059706 A1* | 2/2022 | Pala | H10D 62/343 |

FOREIGN PATENT DOCUMENTS

WO 2018048972 A1 3/2018

* cited by examiner

*Primary Examiner* — Eric A. Ward
(74) *Attorney, Agent, or Firm* — Murphy, Bilak & Homiller, PLLC

(57) ABSTRACT

A trench junction field effect transistor (trench JFET) includes a mesa region confined by first and second trenches along a first lateral direction. The first and second trenches extend into a semiconductor body from a first surface of the semiconductor body. A mesa channel region of a first conductivity type is confined, along the first lateral direction, by first and second gate regions of a second conductivity type. A first pn junction is defined by the mesa channel region and the first gate region. A second pn junction is defined by the mesa channel region and the second gate region. The mesa channel region includes, along the first lateral direction, first, second and third mesa channel sub-regions having a same extent along the first lateral direction.

19 Claims, 2 Drawing Sheets

TRENCH JUNCTION FIELD EFFECT TRANSISTOR HAVING A MESA REGION

TECHNICAL FIELD

The present disclosure is related to a semiconductor device, in particular to a trench junction field effect transistor, trench JFET, including a mesa region.

BACKGROUND

Technology development of new generations of semiconductor devices, e.g. junction field effect transistors (JFETs), aims at improving electric device characteristics and reducing costs by shrinking device geometries. Although costs may be reduced by shrinking device geometries, a variety of tradeoffs and challenges have to be met when increasing device functionalities per unit area. For example, a trade-off between area-specific on-state resistance, $R_{on}xA$, and reliability requirements influenced by, for example, variability of a pinch off voltage, requires design optimization.

Thus, there is a need for an improved junction field effect transistor.

SUMMARY

An example of the present disclosure relates to a trench junction field effect transistor, trench JFET. The JFET includes a mesa region confined by first and second trenches along a first lateral direction. The first and second trenches extend into a semiconductor body from a first surface of the semiconductor body. The JFET further includes a mesa channel region of a first conductivity type confined, along the first lateral direction, by first and second gate regions of a second conductivity type. The JFET further includes a first pn junction being defined by the mesa channel region and the first gate region, and a second pn junction being defined by the mesa channel region and the second gate region. The mesa channel region includes, along the first lateral direction, first, second and third mesa channel sub-regions having a same extent along the first lateral direction. A concentration of dopants of the first conductivity type averaged along the first lateral direction in the second mesa channel sub-region is larger than a concentration of dopants of the first conductivity type averaged along the first lateral direction in each of the first and third mesa channel sub-regions.

Another example of the present disclosure relates to a method for manufacturing a trench junction field effect transistor, trench JFET. The method includes forming a mesa region confined by first and second trenches along a first lateral direction. The first and second trenches extend into a semiconductor body from a first surface of the semiconductor body. The method further incudes forming a mesa channel region of a first conductivity type confined, along the first lateral direction, by first and second gate regions of a second conductivity type. A first pn junction is defined by the mesa channel region and the first gate region, and a second pn junction is defined by the mesa channel region and the second gate region. The mesa channel region includes, along the first lateral direction, first, second and third mesa channel sub-regions having a same extent along the first lateral direction. A concentration of dopants of the first conductivity type averaged along the first lateral direction in the second mesa channel sub-region is larger than a concentration of dopants of the first conductivity type averaged along the first lateral direction in each of the first and third mesa channel sub-regions.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of JFETs and together with the description serve to explain principles of the examples. Further examples are described in the following detailed description and the claims.

DETAILED DESCRIPTION

Figure 1:
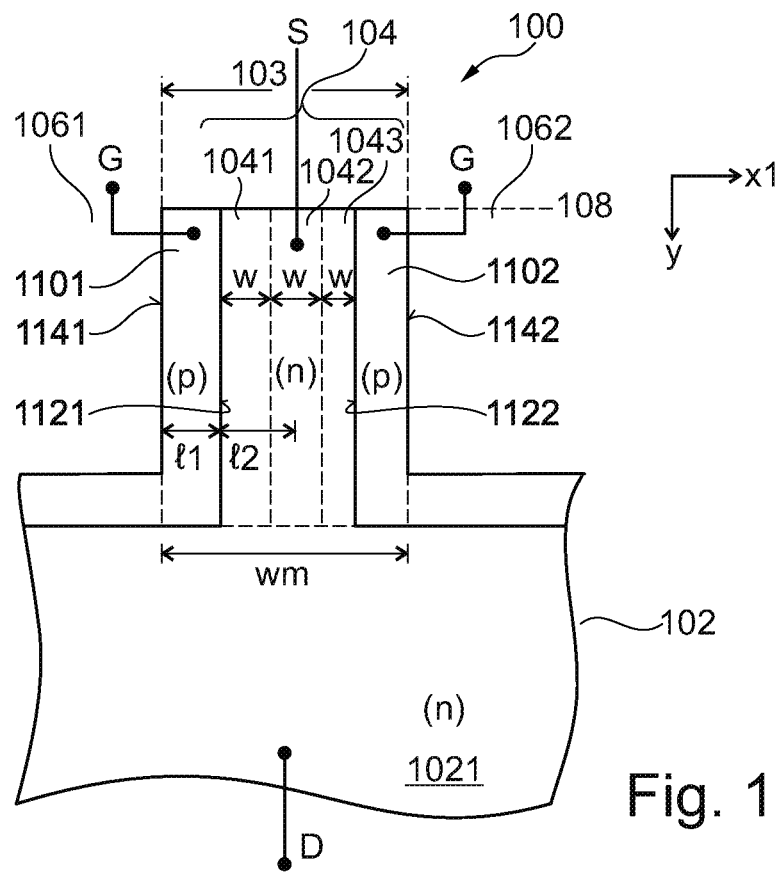
FIG. 1 is a partial cross-sectional view for illustrating an example of a trench JFET.

In the following detailed description, reference is made to the accompanying drawings, which form a part hereof and in which are shown by way of illustrations specific examples of JFETs. It is to be understood that other examples may be utilized and structural or logical changes may be made without departing from the scope of the present disclosure. For example, features illustrated or described for one example can be used in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction.

Ranges given for physical dimensions include the boundary values. For example, a range for a parameter y from a to b reads as a≤y≤b. The same holds for ranges with one boundary value like "at most" and "at least".

The terms "on" and "over" are not to be construed as meaning only "directly on" and "directly over". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

An example of a trench junction field effect transistor, trench JFET, includes a mesa region confined by first and second trenches along a first lateral direction. The first and second trenches extend into a semiconductor body from a first surface of the semiconductor body. The JFET further includes a mesa channel region of a first conductivity type confined, along the first lateral direction, by first and second gate regions of a second conductivity type. The JFET further includes a first pn junction being defined by the mesa channel region and the first gate region, and a second pn junction being defined by the mesa channel region and the second gate region. The mesa channel region includes, along the first lateral direction, first, second and third mesa channel sub-regions having a same extent along the first lateral direction. A concentration of dopants of the first conductivity type averaged along the first lateral direction in the second mesa channel sub-region is larger than a concentration of dopants of the first conductivity type averaged along the first lateral direction in each of the first and third mesa channel sub-regions.

The JFET may be part of an integrated circuit, or may define a discrete semiconductor device or a semiconductor module, for example. For example, the JFET may be a trenched and implanted vertical-channel JFET, TI-VJFET. In a vertical-channel JFET, a load current flow is between a first load electrode over the first surface of the semiconductor body and a second load electrode over the second surface. In the vertical-channel JFET, a load current may flow along the vertical direction perpendicular to the first and/or second surface.

The first surface may be a front surface or a top surface of the semiconductor body, and the second surface may be a back surface or a rear surface of the semiconductor body, for example. For example, the semiconductor body may be attached to a lead frame via the second surface, for example. Over the first surface of the semiconductor body, bond pads may be arranged and bond wires may be bonded on the bond pads, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be a crystalline SiC semiconductor substrate. For example, the silicon carbide crystal may have a hexagonal polytype, e.g., 4H or 6H. The silicon carbide semiconductor body may be homogeneously doped or may include differently doped SiC layer portions. The silicon carbide semiconductor body may include one or more layers from another material with a melting point close to or higher than crystalline silicon carbide. For example, the layers from another material may be embedded in the crystalline silicon carbide substrate. The silicon carbide semiconductor substrate may have two essentially parallel main surfaces of the same shape and size and a lateral surface area connecting the edges of the two main surfaces.

The JFET may be configured to conduct currents of more than 1A or more than 10 A or even more than 100 A. For example, the JFET may be designed as a transistor cell array of a plurality of transistor cells having a same layout. The transistor cell array may be a 1-dimensional or a 2-dimensional regular arrangement of the plurality of transistor cells. For example, the plurality of transistor cells of the transistor cell array may be electrically connected in parallel. For example, source regions of the plurality of transistor cells of the vertical-channel JFET transistor cell array may be electrically connected together. Likewise, drain regions of the plurality of transistor cells of the vertical-channel JFET transistor cell array may be electrically connected together. For example, gate regions of the plurality of transistor cells of the vertical-channel JFET transistor cell array may be electrically connected together. A transistor cell of the transistor cell array or a part thereof, e.g. the gate region, may be designed in the shape of a stripe, a polygon, a circle or an oval, for example.

A number of transistor cells of the transistor cell array may depend on the maximum load current, for example. For example, a number of transistor cells of the transistor cell array may be larger than 100, or larger than 1000, or even larger than 10000, for example. The JFET may be further configured to block voltages between the load electrodes, e.g. between drain and source of the JFET, of more than 60V, 100V, 400 V, 650V, 1.2 kV, 1.7 kV, 3.3 kV, 4.5 kV, 5.5 kV, 6 kV, 6.5 kV, 10 kV. The blocking voltage may correspond to a voltage class specified in a datasheet of the JFET, for example. The blocking voltage of the JFET may be adjusted by an impurity concentration and/or a vertical extension of a drift region in the semiconductor body. A doping concentration of the drift region may gradually or in steps increase or decrease with increasing distance to the first surface at least in portions of its vertical extension. According to other examples the impurity concentration in the drift region may be approximately uniform. For JFETs based on silicon, a mean impurity concentration in the drift region may be between $2\times10^{12}$ cm$^{-3}$ and $1\times10^{17}$ cm$^{-3}$, for example in a range from $5\times10^{12}$ cm$^{-3}$ to $1\times10^{15}$ cm$^{-3}$ or to $2\times10^{15}$ cm$^{-3}$. In some cases, the mean impurity concentration in the drift region for JFETs based on silicon may be in a range from $1\times10^{15}$ cm$^{-3}$ to $1\times10^{17}$ cm$^{-3}$. In the case of a JFET based on SiC, a mean impurity concentration in the drift region may be between $5\times10^{14}$ cm$^{-3}$ and $1\times10^{17}$ cm$^{-3}$, for example in a range from $1\times10^{15}$ cm$^{-3}$ to $2\times10^{16}$ cm$^{-3}$. A vertical extension of the drift region may depend on voltage blocking requirements, e.g. a specified voltage class, of the vertical JFET. When operating the vertical JFET in voltage blocking mode, a space charge region may vertically extend partly or totally through the drift region depending on the blocking voltage applied to the vertical JFET.

The source electrode and the drain electrode may be part of a wiring area over the semiconductor body. The wiring area may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an interlayer dielectric structure may be arranged. Contact plug(s) or contact line(s) may be formed in openings in the interlayer dielectric structure to electrically connect parts, e.g. metal lines or contact areas, of different wiring levels to one another. The source electrode may be formed by one or more elements of the wiring area over the first surface.

Likewise, the drain electrode may be formed by one or more elements of the wiring area over the second surface.

The mesa channel region of the first conductivity type and the first and second gate regions of the second conductivity type define the mesa region that is confined, along the first lateral direction, by the first and second trenches. Each of the first and second trenches may be at least partly filled with a trench structure. For example, the trench structure may include a dielectric structure. The dielectric structure may include a plurality of merged dielectric parts that may differ in material, for example. The dielectric structure may be or may include an insulating material such as an oxide, e.g., $SiO_2$, a nitride, e.g., $Si_3N_4$, a high-k dielectric, or a low-k dielectric, or any combination thereof. For example, the dielectric structure may be formed as a disposed oxide (TEOS). The trench structure may further include a gate contact that is electrically connected to the semiconductor body, e.g. the first and second gate regions and/or a body region, through an opening in the dielectric structure, e.g. at a bottom side of the first and second trenches. The gate contact may be formed of one or more conductive materials, e.g. metal, metal silicide, metal compound, highly doped semiconductor material such as highly doped polycrystalline silicon. For example, the gate contact may be a single layer, e.g. a highly doped polycrystalline layer, or a stack of layers.

The first, second and third mesa channel sub-regions have a same extent along the first lateral direction with respect to any vertical distance to the first surface. In case the distance between the first pn junction and the second pn junction slightly varies along a vertical direction, e.g. due to a sidewall taper of the first and second trenches, also the extent of the first, second and third mesa channel regions slightly varies along the vertical direction for sub-dividing the mesa channel region into three parts having a same lateral extent. For example, the concentration of dopants of the first conductivity type averaged along the first lateral direction in the second mesa channel sub-region may be larger than a concentration of dopants of the first conductivity type averaged along the first lateral direction in each of the first and third mesa channel sub-regions with respect to a vertical distance to the first surface that corresponds to 70%, or 60%, or 50%, or 40%, or 30% of a depth of each of the first and second trenches. The depth of each of the first and second trenches may correspond to a bottom side of a dielectric structure or a bottom side of a gate contact of the trench structure, for example, dopants in SiC may include Al, B, Be, Ga, or any combination thereof for p-type doping, an N, P, or any combination thereof for n-type doping. For example, dopants in Si may include Al, B, Ga, In, or any combination thereof for p-type doping, an P, As, Sb, hydrogen-related donors, or any combination thereof for n-type doping.

By providing a trench JFET having the above relation with respect to concentration of dopants, compensation of a channel charge amount caused by an overlap of doping profiles of the gate regions and the mesa channel region may be reduced. This allows for stabilizing the charge amount in the mesa channel. Thus, variability of a pinch off voltage or threshold voltage of the trench JFET may be reduced.

For example, an extent of the mesa region along the first lateral direction may range from 200 nm to 2 μm., or from 300 nm to 1.6 μm, or from 400 nm to 1.2 μm.

For example, along the first lateral direction, the concentration of dopants of the first conductivity type at a center of the second mesa channel sub-region may be at least 2 times larger than at the first pn junction. In some examples, the concentration of dopants of the first conductivity type at a center of the second mesa channel sub-region is at least 3 times larger, or even four times larger than at the first pn junction or at the second pn junction. This may allow for further reducing the variability of a pinch off voltage or threshold voltage of the trench JFET.

For example, along the first lateral direction, a first distance between the first pn junction and a nearest sidewall of the mesa region may be smaller than twice a second distance between the first pn junction and a center of the second mesa channel sub-region. The center of the second mesa channel sub-region corresponds to a center of the mesa region. In some examples, along the first lateral direction, a first distance between the first pn junction and a nearest sidewall of the mesa region may be smaller than the second distance between the first pn junction and a center of the second mesa channel sub-region.

For example, a profile of the concentration of dopants of the first conductivity type along the first lateral direction may have one or more doping peaks, and at least one of the one or more doping peaks has a distance, along the first lateral direction, to the center of the second mesa channel sub-region that is smaller than to a nearest one of the first and second pn junctions. This may allow for concentrating the mesa channel charge amount close to the center of the mesa channel. Thus, variability of a pinch off voltage or threshold voltage of the trench JFET may be further reduced.

For example, all of the one or more doping peaks may have a smaller distance, along the first lateral direction, to the center of the second mesa channel sub-region than to a nearest one of the first and second pn junctions.

For example, along the first lateral direction, the concentration of dopants of the first conductivity type at a center of the second mesa channel sub-region may be larger than 20%, or larger than 50% of a maximum concentration of dopants of the first conductivity type in the mesa channel region. This may allow for a further concentration of the mesa channel charge amount close to a center of the mesa channel. Thus, variability of a pinch off voltage or threshold voltage of the trench JFET may be further reduced.

For example, the profile of concentration of dopants of the first conductivity type along the first lateral direction may be mirror-symmetrical to a center of the mesa channel region.

For example, the profile of the concentration of dopants of the first conductivity type along the first lateral direction may have two doping peaks, a half peak width being a distance along the first lateral direction from where a concentration of dopants of the first conductivity type at each of the two doping peaks decreases towards a nearest one of the first and second pn junctions by a factor of 1/e, e being Euler's number. A distance between the two doping peaks along the first lateral direction may range from 50% to 400% of the half peak width.

Another aspect of the present disclosure relates to another trench JFET. The trench JFET includes a mesa region confined by first and second trenches along a first lateral direction. The first and second trenches extend into a semiconductor body from a first surface of the semiconductor body. The JFET further includes a mesa channel region of a first conductivity type confined, along the first lateral direction, by first and second gate regions of a second conductivity type. The JFET further includes a first pn junction being defined by the mesa channel region and the first gate region, and a second pn junction being defined by the mesa channel region and the second gate region. The mesa channel region includes, along the first lateral direction, first, second and third mesa channel sub-regions having a same extent along the first lateral direction. Along the first lateral direction, the concentration of dopants of the first conductivity type at a center of the second mesa channel sub-region is at least 2 times larger than at the first pn junction.

Another aspect of the present disclosure relates to another trench JFET. The trench JFET includes a mesa region confined by first and second trenches along a first lateral direction. The first and second trenches extend into a semiconductor body from a first surface of the semiconductor body. The JFET further includes a mesa channel region of a first conductivity type confined, along the first lateral direction, by first and second gate regions of a second conductivity type. The JFET further includes a first pn junction being defined by the mesa channel region and the first gate region, and a second pn junction being defined by the mesa channel region and the second gate region. The mesa channel region includes, along the first lateral direction, first, second and third mesa channel sub-regions having a same extent along the first lateral direction. A profile of the concentration of dopants of the first conductivity type has one or more doping peaks along the first lateral direction, and at least one of the one or more doping peaks has a distance, along the first lateral direction, to the center of the second mesa channel sub-region that is smaller than to a nearest one of the first and second pn junctions.

Another aspect of the present disclosure relates to another trench JFET. The trench JFET includes a mesa region confined by first and second trenches along a first lateral direction. The first and second trenches extend into a semiconductor body from a first surface of the semiconductor body. The JFET further includes a mesa channel region of a first conductivity type confined, along the first lateral direction, by first and second gate regions of a second conductivity type. The JFET further includes a first pn junction being defined by the mesa channel region and the first gate region, and a second pn junction being defined by the mesa channel region and the second gate region. The mesa channel region includes, along the first lateral direction, first, second and third mesa channel sub-regions having a same extent along the first lateral direction. Along the first lateral direction, the concentration of dopants of the first conductivity type at a center of the second mesa channel sub-region is larger than 20%, or larger than 50% of a maximum concentration of dopants of the first conductivity type in the mesa channel region.

Another aspect of the present disclosure relates to another trench JFET. The trench JFET includes a mesa region confined by first and second trenches along a first lateral direction. The first and second trenches extend into a semiconductor body from a first surface of the semiconductor body. The JFET further includes a mesa channel region of a first conductivity type confined, along the first lateral direction, by first and second gate regions of a second conductivity type. The JFET further includes a first pn junction being defined by the mesa channel region and the first gate region, and a second pn junction being defined by the mesa channel region and the second gate region. The mesa channel region includes, along the first lateral direction, first, second and third mesa channel sub-regions having a same extent along the first lateral direction. The profile of the concentration of dopants of the first conductivity type has two doping peaks along the first lateral direction, a half peak width being a distance along the first lateral direction from where a concentration of dopants of the first conductivity type at each of the two doping peaks decreases towards a nearest one of the first and second pn junctions by a factor of 1/e, e being Euler's number. A distance between the two doping peaks along the first lateral direction ranges from 50% to 400% of the half peak width.

Details with respect to structure, or function, or technical benefit of features described above with respect to a trench JFET likewise apply to the exemplary methods described herein. Processing the semiconductor body may comprise one or more optional additional features corresponding to one or more aspects mentioned in connection with the proposed concept or one or more examples described above or below.

An example of the present disclosure relates to a method for manufacturing a trench junction field effect transistor, trench JFET. The method includes forming a mesa region confined by first and second trenches along a first lateral direction, the first and second trenches extending into a semiconductor body from a first surface of the semiconductor body. The method further includes forming a mesa channel region of a first conductivity type confined, along the first lateral direction, by first and second gate regions of a second conductivity type, a first pn junction being defined by the mesa channel region and the first gate region, and a second pn junction being defined by the mesa channel region and the second gate region. The mesa channel region includes, along the first lateral direction, first, second and third mesa channel sub-regions having a same extent along the first lateral direction. A concentration of dopants of the first conductivity type averaged along the first lateral direction in the second mesa channel sub-region is larger than a concentration of dopants of the first conductivity type averaged along the first lateral direction in each of the first and third mesa channel sub-regions.

For example, forming the mesa channel region may include at least one tilted ion implantation process of dopants of the first conductivity type, and an ion implantation tilt angle may range between 5° and 35°. By adjusting the tilt angle, the mesa channel charge amount may be concentrated close to a center of the mesa channel.

For example, forming the mesa channel region may include at least one ion implantation process of dopants of the first conductivity type, and an ion implantation energy may range between 300 KeV and 2 MeV. By adjusting the ion implantation energy for the dopants of the first conductivity type, the mesa channel charge amount may be concentrated close to a center of the mesa channel.

For example, forming the first and second gate regions may include at least one ion implantation process of dopants of the second conductivity type, and an ion implantation energy may range between 10 KeV and 500 keV.

For example, forming the mesa channel region may include at least one ion implantation process of dopants of the first conductivity type configured for a penetration depth of the dopants of the first conductivity type along the first lateral direction that is larger than half of an extent of the mesa region along the first lateral direction.

The examples and features described above and below may be combined.

Functional and structural details described with respect to the examples above shall likewise apply to the exemplary examples illustrated in the figures and described further below.

In the following, further examples of trench junction field effect transistors, trench JFETs, are explained in connection with the accompanying drawings. Functional and structural details described with respect to the examples above shall likewise apply to the exemplary embodiments illustrated in the figures and described further below. In the illustrated examples, the first conductivity is n-type and the second conductivity type is p-type for an n-channel trench JFET. However, the first conductivity type may also be p-type and the second conductivity type may be n-type for a p-channel FET.

FIG. 1 schematically and exemplarily shows a trench JFET 100. The JFET 100 includes a mesa region 103 confined by first and second trenches 1061, 1062 along a first lateral direction x1. The first and second trenches 1061, 1062 extend into a semiconductor body 102 from a first surface 108 of the semiconductor body 102. An n-doped mesa channel region 104 is confined, along the first lateral direction x1, by first and second p-doped gate regions 1101, 1102. A first pn junction 1121 is defined by the mesa channel region 104 and the first gate region 1101. A second pn junction 1122 is defined by the mesa channel region 104 and the second gate region 1102. The mesa channel region 104 is divided, along the first lateral direction x1, into first, second and third mesa channel sub-regions 1041, 1042, 1043 having a same extent w along the first lateral direction x1.

For example, an extent wm of the mesa region 103 along the first lateral direction x1 may range from 200 nm to 2 µm, or from 300 nm to 1.6 µm, or from 400 nm to 1.2 µm.

For the mesa channel region 104, at least one of the following features applies:
  a concentration of n-type dopants averaged along the first lateral direction x1 in the second mesa channel sub-region 1042 is larger than a concentration of p-type dopants of the first conductivity type averaged along the first lateral direction x1 in each of the first and third mesa channel sub-regions 1041, 1043;
  along the first lateral direction x1, the concentration of n-type dopants at a center of the second mesa channel sub-region 1042 is at least 2 times larger than at the first pn junction 1121;
  a profile of the concentration of n-type dopants along the first lateral direction x1 has one or more doping peaks, and at least one of the one or more doping peaks has a distance, along the first lateral direction x1, to the center of the second mesa channel sub-region 1142 that is smaller than to a nearest one of the first and second pn junctions 1141, 1142;
  along the first lateral direction x1, the concentration of n-type dopants at a center of the second mesa channel sub-region 1042 is larger than 20% of a maximum concentration of n-type dopants in the mesa channel region 104;
  the profile of the concentration of n-type dopants along the first lateral direction x1 has two doping peaks, a half peak width being a distance along the first lateral direction x1 from where a concentration of n-type dopants at each of the two doping peaks decreases towards a nearest one of the first and second pn junctions 1121, 1122 by a factor of 1/e, e being Euler's number, and a distance between the two doping peaks along the first lateral direction x1 ranges between 50% to 400% of the half peak width.

The gate regions 1101, 1102 are electrically connected to a gate electrode G. The gate electrode G may include a gate contact filling at least part of the trenches 1061, 1062 (not illustrated in FIG. 1). The mesa channel region 104 is electrically connected to a source electrode S, e.g. via an n⁺-doped source region at the first surface 108 (not illustrated in FIG. 1). The mesa channel region 104 turns into an n-doped drift region 1021. The n-doped drift region 1021 is electrically connected to a drain electrode D via a second surface of the semiconductor body 102, the second surface being opposite to the first surface 108.

Figure 2:
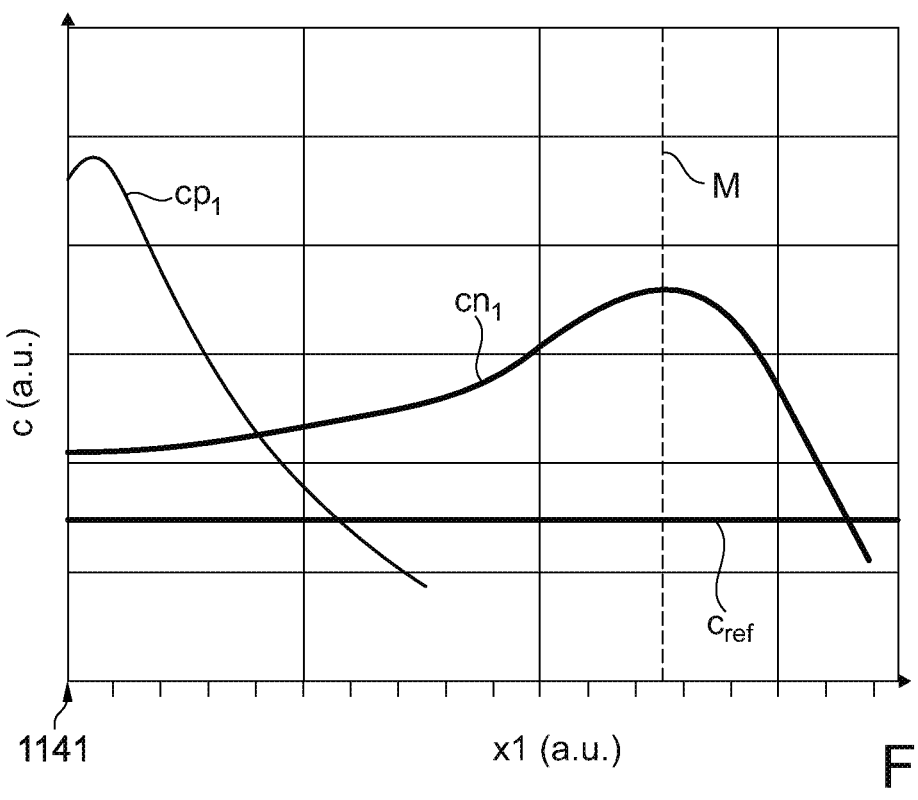
FIGS. 2 to 4 are schematic graphs for illustrating doping concentration profiles in the trench JFET of FIG. 1.

FIG. 2 schematically and exemplarily illustrates parts of doping concentration profiles c of p-type doping cp1 and n-type doping cn1 introduced into the mesa region 103 by ion implantation through a first sidewall 1141 of the mesa region 103 illustrated in FIG. 1. An n-type background doping concentration profile cref is exemplarily illustrated as a constant doping profile. A center M of the mesa region 103 corresponds to a center of the second mesa channel sub-region 1042. An exemplary ion implantation tilt angle for forming the profile cn may range between 5° and 35°, for example. An exemplary ion implantation energy for forming the profile cn may range between 300 KeV and 2 MeV, for example. An exemplary ion implantation energy for forming the profile cp may range between 10 KeV and 500 keV, for example.

Figure 3:
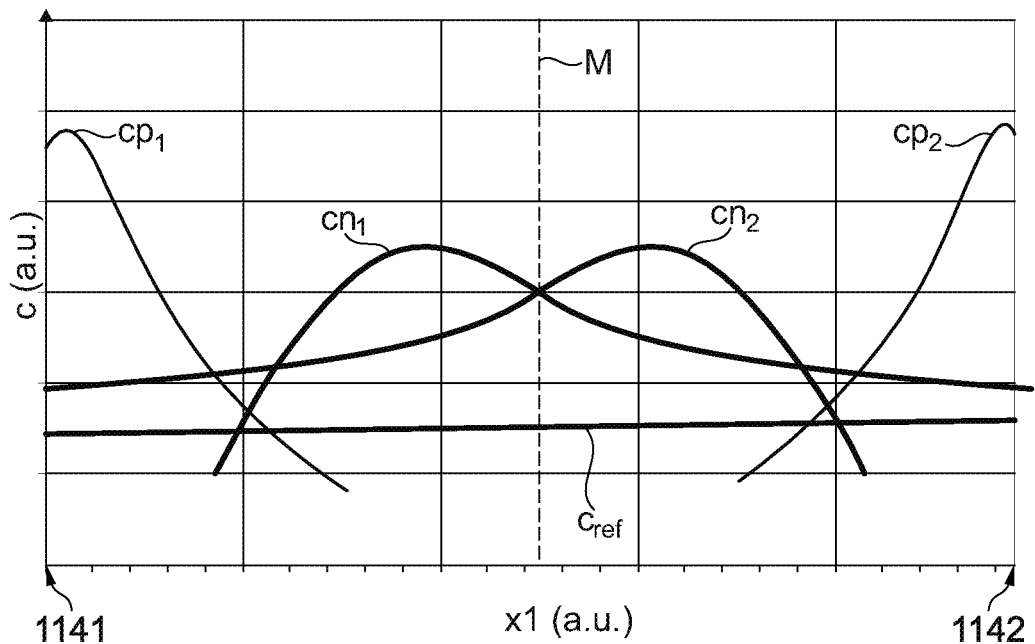

The schematic and exemplary graph of FIG. 3 is similar to FIG. 2 and further illustrates, i.e. in addition to the profiles cn1, cp1 introduced through the first sidewall 1141 by ion implantation, doping concentration profiles c of p-type doping cp2 and n-type doping cn2 introduced into the mesa region 103 by ion implantation through a second sidewall 1142 of the mesa region 103 illustrated in FIG. 1.

Figure 4:
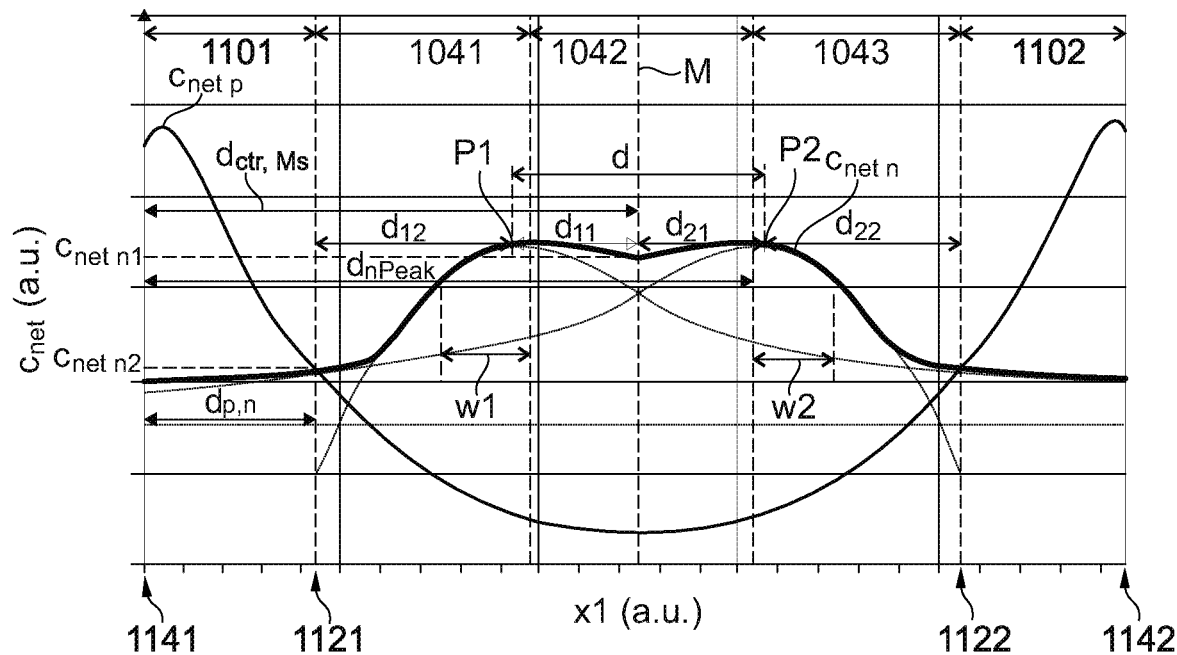

The schematic and exemplary graph of FIG. 4 illustrates net doping concentration profiles cnet of the profiles illustrated in FIG. 3. The net doping concentration profile cnetp corresponds to the sum of the p-doping profiles cp1, cp2, i.e. cnetp=cp1+cp2, and the net doping concentration profile cnetn corresponds to the sum of the n-doping profiles cn1, cn2, cref, i.e. cnetn=cn1+cn2+cref.

In the first and second gate regions 1101, 1102, the net p-doping concentration profile cnetp exceeds the net n-doping concentration profile cnetn. In the first, second, and third mesa channel sub-regions 1041, 1042, 1043, the net n-doping concentration profile cnetn exceeds the net p-doping concentration profile cnetp. The first pn junction 1121 defines the transition between the first gate region 1101 and the first mesa channel sub-region 1041. The second pn junction 1122 defines the transition between the second gate region 1102 and the third mesa channel sub-region 1043.

The exemplary net n-doping concentration profile cnetn has two peaks P1, P2. In other examples, one, three, four, five, six, or even more peaks may be present by adjusting the ion implantation processes, e.g. number of ion implantation processes. When increasing the number of ion implantation processes for forming the net n-doping concentration profile cnetn, a doping concentration plateau may be formed in the center of the mesa region 103, for example.

For the exemplary net n-doping concentration profile cnetn, a concentration of n-dopants of averaged along the first lateral direction x1 in the second mesa channel sub-region 1042 is larger than a concentration of n-dopants averaged along the first lateral direction x1 in each of the first and third mesa channel sub-regions 1041, 1043.

The concentration of n-dopants cnnetn1 at the center M of the second mesa channel sub-region 1042 may be at least 2 times larger than the concentration cnetn2 at the first pn junction 1121.

The doping peak P1 has a distance d11, along the first lateral direction x1, to the center M of the second mesa channel sub-region 1042 that is smaller than a distance d12 to the first pn junction 1121. Likewise, the doping peak P2 has a distance d21, along the first lateral direction x1, to the center M of the second mesa channel sub-region 1042 that is smaller than a distance d22 to the second pn junction 1122.

A first half peak width w1 in FIG. 4 denotes a distance along the first lateral direction x1 from where a concentration of n-dopants at the doping peak P1 decreases towards the first pn junction 1121 by a factor of 1/e, e being Euler's number. A distance d between the two doping peaks P1, P2 along the first lateral direction x1 may range between 50% and 400% of the first half peak width w1. Likewise, a second half peak width w2 in FIG. 4 denotes a distance along the first lateral direction x1 from where a concentration of n-dopants at the doping peak P2 decreases towards the second pn junction 1122 by a factor of 1/e, e being Euler's number. A distance d between the two doping peaks P1, P2 along the first lateral direction x1 may range between 50% and 400% of the second half peak width w1.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A trench junction field effect transistor (trench JFET), comprising:
   a mesa region confined by first and second trenches along a first lateral direction, the first and second trenches extending into a semiconductor body from a first surface of the semiconductor body,
   wherein between the first and second trenches, the mesa region includes a mesa channel region of a first conductivity type and first and second gate regions of a second conductivity type,
   wherein the mesa channel region is confined, along the first lateral direction, by the first and second gate regions,
   wherein a first pn junction is defined by the mesa channel region and the first gate region,
   wherein a second pn junction is defined by the mesa channel region and the second gate region,
   wherein the mesa channel region includes, along the first lateral direction, first, second and third mesa channel sub-regions having a same extent along the first lateral direction,
   wherein a concentration of dopants of the first conductivity type averaged along the first lateral direction in the second mesa channel sub-region is larger than a concentration of dopants of the first conductivity type averaged along the first lateral direction in each of the first and third mesa channel sub-regions.

2. The trench JFET of claim 1, wherein an extent of the mesa region along the first lateral direction ranges 200 nm and 2 μm.

3. The trench JFET of claim 1, wherein along the first lateral direction, the concentration of dopants of the first conductivity type at a center of the second mesa channel sub-region is at least 2 times larger than at the first pn junction.

4. The trench JFET of claim 1, wherein along the first lateral direction, a first distance between the first pn junction and a nearest sidewall of the mesa region is smaller than twice a second distance between the first pn junction and a center of the second mesa channel sub-region.

5. The trench JFET of claim 1, wherein a profile of the concentration of dopants of the first conductivity type along the first lateral direction has one or more doping peaks, and wherein at least one of the one or more doping peaks has a distance, along the first lateral direction, to the center of the second mesa channel sub-region that is smaller than to a nearest one of the first and second pn junctions.

6. The trench JFET of claim 5, wherein all of the one or more doping peaks have a smaller distance, along the first lateral direction, to the center of the second mesa channel sub-region than to a nearest one of the first and second pn junctions.

7. The trench JFET of claim 1, wherein the profile of concentration of dopants of the first conductivity type along the first lateral direction is mirror-symmetrical to a center of the mesa channel region.

8. The trench JFET of claim 1, wherein the profile of the concentration of dopants of the first conductivity type along the first lateral direction has two doping peaks, a half peak width being a distance along the first lateral direction from where a concentration of dopants of the first conductivity type at each of the two doping peaks decreases towards a nearest one of the first and second pn junctions by a factor of 1/e, e being Euler's number, and wherein a distance between the two doping peaks along the first lateral direction ranges between 50% to 400% of the half peak width.

9. The trench JFET of claim 1, wherein a center of the mesa region corresponds to a center of the second mesa channel sub-region.

10. The trench JFET of claim 1, wherein the second mesa channel sub-region is interposed between the first and third mesa channel sub-regions along the first lateral direction.

11. The trench JFET of claim 1, wherein a vertical centerline of the mesa region is perpendicular to the first lateral direction and runs through the second mesa channel sub-region.

12. A method for manufacturing a trench junction field effect transistor (trench JFET), the method comprising:
   forming a mesa region confined by first and second trenches along a first lateral direction, the first and second trenches extending into a semiconductor body from a first surface of the semiconductor body,
   wherein forming the mesa region comprises forming, between the first and second trenches, a mesa channel region of a first conductivity type and first and second gate regions of a second conductivity type,
   wherein the mesa channel region is confined, along the first lateral direction, by the first and second gate regions,
   wherein a first pn junction is defined by the mesa channel region and the first gate region,
   wherein a second pn junction is defined by the mesa channel region and the second gate region,
   wherein the mesa channel region includes, along the first lateral direction, first, second and third mesa channel sub-regions having a same extent along the first lateral direction,
   wherein a concentration of dopants of the first conductivity type averaged along the first lateral direction in the second mesa channel sub-region is larger than a concentration of dopants of the first conductivity type averaged along the first lateral direction in each of the first and third mesa channel sub-regions.

13. The method of claim 12, wherein forming the mesa channel region includes at least one tilted ion implantation process of dopants of the first conductivity type, and wherein an ion implantation tilt angle ranges between 5° and 35°.

14. The method of claim 12, wherein forming the mesa channel region includes at least one ion implantation process of dopants of the first conductivity type, and wherein an ion implantation energy ranges between 300 KeV and 2 MeV.

15. The method of claim 12, wherein forming the first and second gate regions includes at least one ion implantation process of dopants of the second conductivity type, and wherein an ion implantation energy ranges between 10 KeV and 500 KeV.

16. The method of claim 12, wherein forming the mesa channel region includes at least one ion implantation process of dopants of the first conductivity type configured for a penetration depth of the dopants of the first conductivity type along the first lateral direction that is larger than half of an extent of the mesa region along the first lateral direction.

17. The method of claim 12, wherein a center of the mesa region corresponds to a center of the second mesa channel sub-region.

18. The method of claim 12, wherein the second mesa channel sub-region is interposed between the first and third mesa channel sub-regions along the first lateral direction.

19. The method of claim 12, wherein a vertical centerline of the mesa region is perpendicular to the first lateral direction and runs through the second mesa channel sub-region.

* * * * *